US006535564B1

(12) United States Patent
Mandyam

(10) Patent No.: US 6,535,564 B1
(45) Date of Patent: Mar. 18, 2003

(54) ADAPTIVE QUANTIZATION IN A PULSE-AMPLITUDE MODULATED SYSTEM

(75) Inventor: Giridhar D. Mandyam, Dallas, TX (US)

(73) Assignee: Nokia Mobile Phones Ltd., Espoo (FI)

( * ) Notice: Subject to any disclaimer, the term of this patent is extended or adjusted under 35 U.S.C. 154(b) by 0 days.

(21) Appl. No.: 09/343,829

(22) Filed: Jun. 30, 1999

Related U.S. Application Data

(60) Provisional application No. 60/128,647, filed on Apr. 9, 1999.

(51) Int. Cl.[7] ........................... H03K 7/02; H04L 27/04

(52) U.S. Cl. .................. 375/353; 375/240.03; 375/295; 332/115

(58) Field of Search ....................... 375/240.02, 240.03, 375/245, 353, 295, 296, 297, 300; 332/115; 348/390.1, 404.1, 405.1; 341/61, 143, 144; 704/222, 230

(56) References Cited

U.S. PATENT DOCUMENTS

| | | | | |
|---|---|---|---|---|
| 4,560,977 A | * 12/1985 | Murakami et al. | .......... | 341/118 |
| 5,787,113 A | 7/1998 | Chow et al. | ................ | 375/219 |
| 6,130,918 A | * 10/2000 | Humphrey et al. | ......... | 375/285 |
| 6,141,640 A | * 10/2000 | Moo | .......................... | 704/222 |

* cited by examiner

*Primary Examiner*—Young T. Tse
(74) *Attorney, Agent, or Firm*—Brian T. Rivers

(57) ABSTRACT

A method and apparatus for adaptively quantizing a digital signal prior to digital-to-analog conversion during pulse shaping in a pulse-amplitude modulated (PAM) system. In the method and apparatus, scaling constants applied to the input signal prior to digital-to-analog conversion change according to the time-varying periodic probability density function (pdf) of the input signal. Spectral components added to the signal due to the adaptive scaling of the method may be removed by performing adaptive amplification on the output signal of the DAC before transmission as a PAM signal.

18 Claims, 2 Drawing Sheets

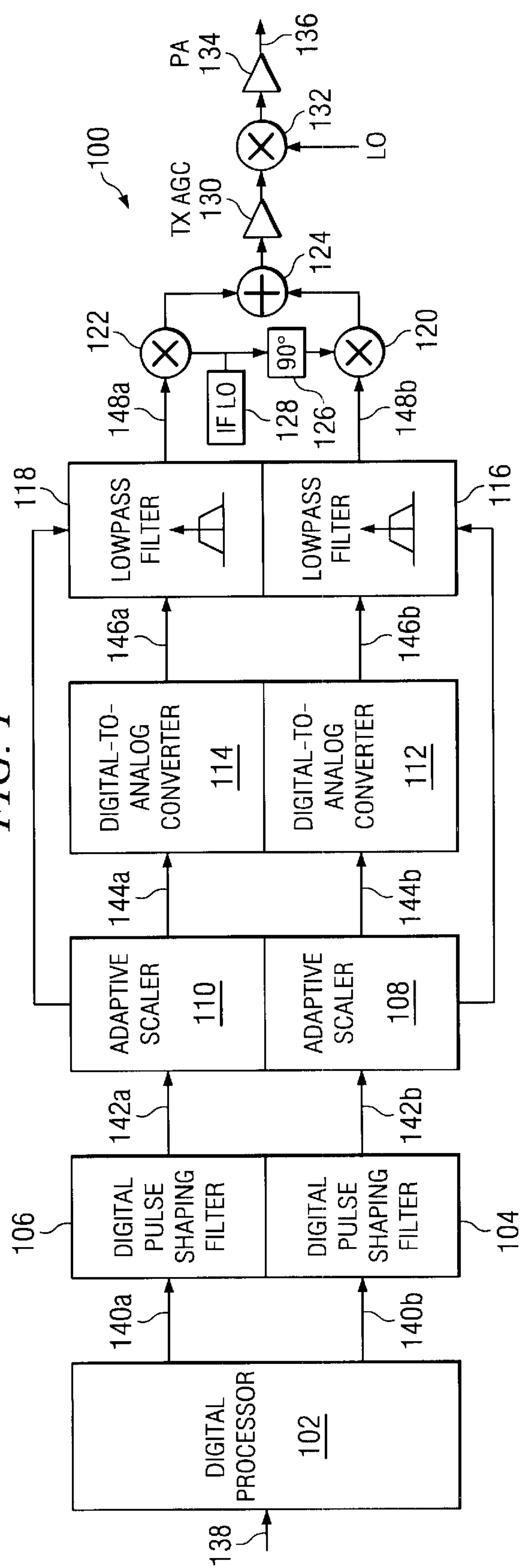
FIG. 1
100
138
DIGITAL PROCESSOR 102
140a
140b
DIGITAL PULSE SHAPING FILTER
106
DIGITAL PULSE SHAPING FILTER
104
142a
142b
ADAPTIVE SCALER 110
ADAPTIVE SCALER 108
144a
144b
DIGITAL-TO-ANALOG CONVERTER 114
DIGITAL-TO-ANALOG CONVERTER 112
146a
146b
LOWPASS FILTER
118
LOWPASS FILTER
116
148a
148b
IF LO
128
90°
126
122
120
124
TX AGC 130
LO
132
PA 134
136

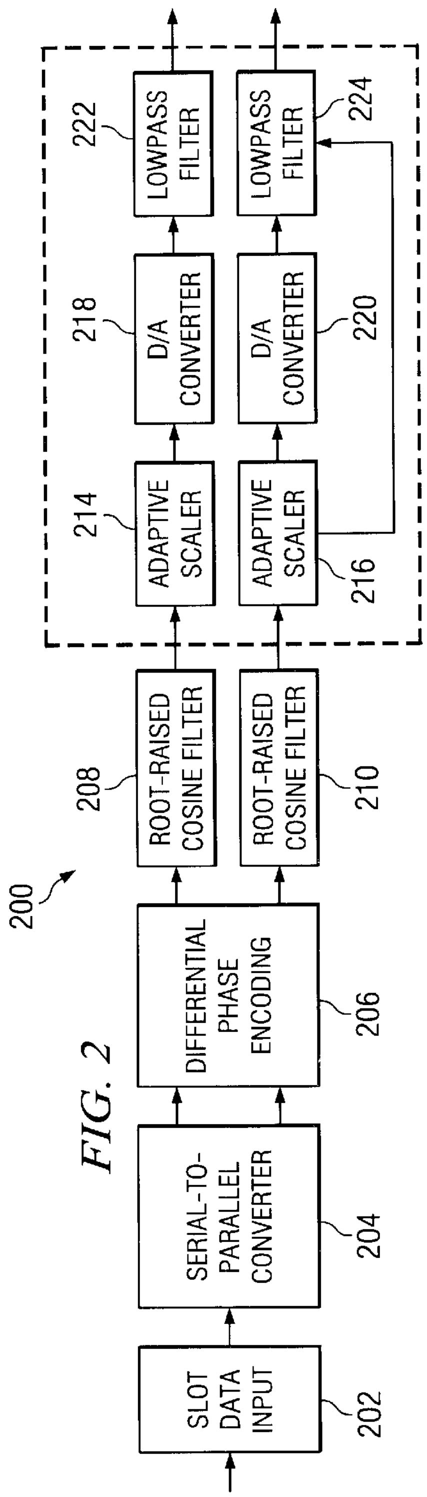
FIG. 2
200
SLOT DATA INPUT
202
SERIAL-TO-PARALLEL CONVERTER
204
DIFFERENTIAL PHASE ENCODING
206
ROOT-RAISED COSINE FILTER
208
ROOT-RAISED COSINE FILTER
210
ADAPTIVE SCALER
214
ADAPTIVE SCALER
216
D/A CONVERTER
218
D/A CONVERTER
220
LOWPASS FILTER
222
LOWPASS FILTER
224

ADAPTIVE QUANTIZATION IN A PULSE-AMPLITUDE MODULATED SYSTEM

CLAIM OF PRIORITY FROM A COPENDING PROVISIONAL PATENT APPLICATION

Priority is herewith claimed under 35 U.S.C. §119(e) from copending Provisional Patent Application No. 60/128,647, filed Apr. 9, 1999, entitled "Adaptive Quantization in A Pulse-Amplitude Modulated System," by Giridhar D. Mandyam. The disclosure of this Provisional Patent Application is incorporated by reference herein in its entirety.

FIELD OF THE INVENTION

This invention relates to telecommunications systems and, more particularly, to a method and apparatus for adaptively quantizing a signal prior to digital-to-analog conversion during pulse shaping in a pulse amplitude modulated system.

BACKGROUND OF THE INVENTION

Pulse amplitude-modulated (PAM) systems involve the transmission of pulse-shaped impulses over a transmission channel. The amplitude of a particular impulse relates directly to the information carried in the impulse. In general, a PAM signal may be expressed by the following expression:

$$y(t) = \sum_{n=-\infty}^{\infty} c_n p(t - nT) \quad \text{Equation 1.0}$$

where $c_n$ represents the amplitude of the $n^{th}$ pulse and p(t) is the pulse shaping waveform, In many modern digital communication systems pulse-shaping is performed digitally. There are several reasons for using digital pulse shaping. Because of matched filtering requirements at the receiver and spectral shaping requirements for electromagnetic compatibility, it is often easier to implement the desired pulse waveform digitally than in the analog domain. Additionally, because attainable sampling frequently affects the ease of design of both the analog-to-digital converter and image rejection filter, digital pulse shaping may be used to increase sampling rate and allow greater ease of design.

Modern digital communication systems may typically use channel aggregation or multicarrier modulation on a transmission link. Certain of these modern digital communication systems include the use of individual channel gain adjustment on the separate channels in order to provide enhanced performance for coherent reverse link reception and quality of service features. However, individual channel gain adjustment results in power adjustment of incoming data, which when combined with pulse shaping, can dramatically affect resultant signal power, and a transmitted signal on a multicarrier link may have a higher peak-to-average ratio in than in a single carrier system. A higher peak-to-average ratio generally requires higher precision and a digital-to-analog converter (DAC) using more bits. In a DAC the signal level must be adjusted to make use of the full conversion range. A higher signal level results in clipping noise. However, using a lower signal level to avoid clipping results in a waste of DAC precision with the quantization power causing a significant amount of quantization noise. As a result, the effective spurious free dynamic range (SFDR) of a signal may degrade in a multicarrier system if quantization effects or clipping distortion due to digital-to-analog conversion are not taken into account. A degradation in SFDR can negatively affect the adjacent channel power rejection (ACPR) in digital pulse-amplitude modulated communication system causing greater intra-channel interference.

SUMMARY OF THE INVENTION

The present invention provides a method and apparatus for adaptively quantizing a digital signal prior to digital-to-analog conversion during pulse shaping in a pulse-amplitude modulated (PAM) system. Implementation of the invention provides a performance advantage in terms of adjacent channel power rejection (ACPR). The method and apparatus utilizes the inherent cyclostationarity of an input pulse-amplitude modulated (PAM) transmission in an adaptive quantization method. In the adaptive quantization method, quantization constants applied to the input PAM signal prior to digital-to-analog conversion change according to the time-varying periodic probability density function (pdf) of the input for PAM signal. The adaptive quantization is optimized for the instantaneous pdf of the input PAM signal, rather than overall possible distributions of the pdf. Spectral components added to the PAM signal due to the adaptive scaling of the method and apparatus may be removed by performing adaptive amplification on the analog output signal of the DAC before transmission. The adaptive amplification prevents the need to transmit scaling data to the receiver.

In an embodiment of the invention, the method and apparatus is implemented in a transmitter of a PAM system transmitting at least one channel over an air interface to a receiver. In the embodiment, signals for at least one channel are digitally processed to generate an information signal and passed through a digital pulse-shaping filter. The output of the digital pulse-shaping filter is then adaptively quantized by processing the filter output through an adaptive scaler and digital-to-analog converter (DAC). The adaptive quantization is performed by determining scaling factors that are used to scale the output of the digital pulse-shaping filter before the signal is input to the DAC. The scaling factors are derived from the probability density function (pdf) of the signal at the output of the digital pulse-shaping filter. The scaling factors are derived by minimizing the mean-squared error between the DAC output signal and DAC input signal over each pdf that exists for the input signal. In order to remove any spectral distortion caused by scaling, the scaled signal may be rescaled after digital-to-analog conversion in the DAC; the resealing may be performed by multiplying the converted signal by 1/k(l) by a lowpass analog filter before transmission.

BRIEF DESCRIPTION OF THE FIGURES

FIG. 1 is a functional block diagram of a CDMA transmitter according to an embodiment of the invention;

FIG. 2 is a functional block diagram of a TDMA transmitter according to an embodiment of the invention;

DETAILED DESCRIPTION OF THE INVENTION

Figure 3A:
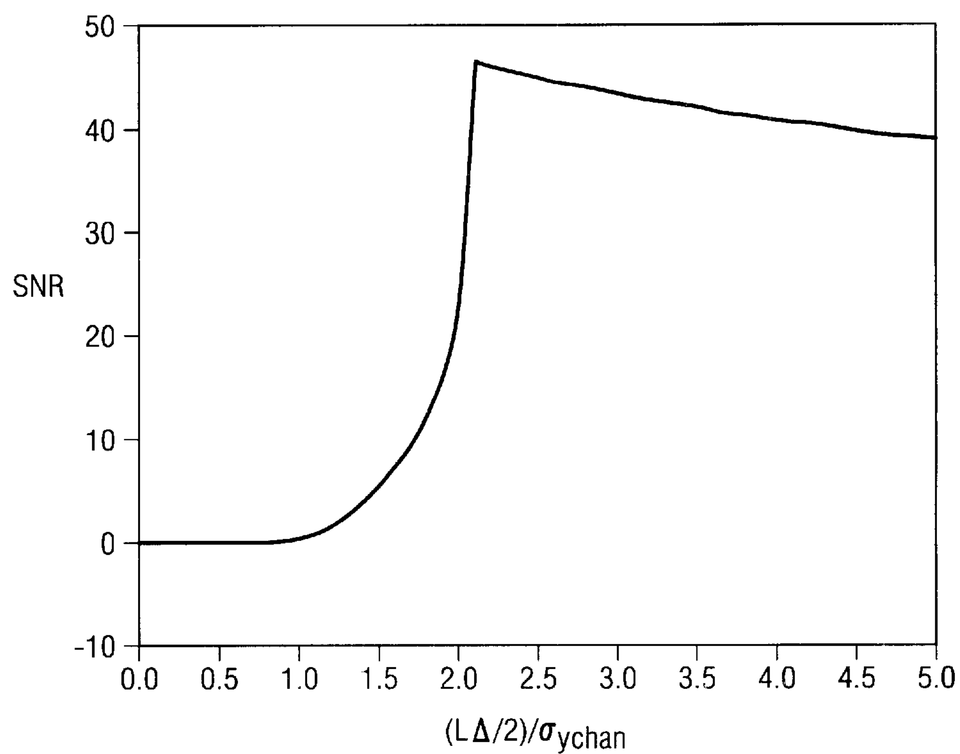
FIG. 3A is a plot illustrating signal-to-quantization noise as a function of scaling constant according to an embodiment of the invention.

Referring now to FIG. 1, therein is illustrated a functional block diagram of a transmitter according to an embodiment of the invention. FIG. 1 shows one channel path of transmitter 100, which may be, for example, implemented according to the standard specified in the TIA/EIA/IS-2000. 1-IS-2000.5 family of standards, published March 1999 (ballot version). Transmitter 100 comprises digital processor 102, digital pulse shaping filters 104, 106, adaptive scalers 108, 110, digital-to-analog converters (DAC) 112, 114, lowpass filters 116, 118, intermediate frequency generator (IF) 128, frequency shifters 120, 122, 126, combiner 124, transmit automatic gain control (TX AGC) 130, baseband multiplier 132 and power amplifier (PA) 134 having output 136.

In the embodiment of the invention, transmitter 100 may transmit aggregate channels having different relative gains for each channel. "Aggregate channel configuration" refers to a channel configuration where multiple physical channels are combined. For example, the cdma2000 uplink may comprise a pilot channel, control channel, fundamental channel and up to two supplemental channel transmissions, all combined into one data stream at input 138 for transmission.

Digital processor 102 receives a signal X at input 138. Digital processor 102 forms I and Q components of the signal X at 140*a* and 140*b*, respectively. Each of the I and Q components of signal X is then filtered in digital pulse shaping filters 106 and 104, respectively. Each signal at output 142*a* and 142*b* of digital pulse shaping filters 106 and 104, respectively, is then adaptively scaled according to the embodiment of the invention in adaptive scalers 110 and 108, respectively. The adaptive scaling is performed by determining scaling constants for each probability diversity function (pdf) of X. In the embodiment, a scaling constant is found for each pdf included in signal X.

The determination of the adaptive scaling constants may be illustrated by using the single channel case of the CDMA channel, for example, a pilot channel, transmitted singularly from transmitter 100. The determinations of the adaptive scaling constants are identical for both the I and Q channels. The adaptive scaling constants may be determined for an aggregate channel configuration in an identical manner. This may be accomplished by observing the resultant signal distribution after channel aggregation and complex modulation, and determining the adaptive scaling constants based on the signal probability density function.

Given the output signal of DAC 112 and 114 has L discrete levels spaced Δ apart, the output signal DAC 112, 114 may be taken from the discrete levels {−(L−1)Δ/2, . . . , −Δ/2,Δ2, . . . ,(L−1) Δ/2}. Assume that the input signal is divided into intervals as x∈{(−∞,−LΔ/2),(−LΔ/2,−(L+2)Δ/2), . . . ,((L−2)Δ/2,LΔ/2),(LΔ/2,∞)}. Thus each of the DAC 112, 114 output signal levels {−(L−1)Δ/2, . . . ,−Δ/2,Δ/2, . . . , (L−1)Δ2} corresponds to the input intervals {(−LΔ/2,−(L+2)Δ/2), . . . ,((L−2)Δ2,LΔ/2)}. The DAC 112, 114 rail output signal levels, {−(L−1)Δ/2,(L−1)Δ/2}, correspond to the input intervals {(−∞,−LΔ/2),(LΔ/2, ∞)}. Thus, if the time-varying symmetric pdf of x is denoted by $p_x(x,i)$, and the pdf of i is denoted by $p_i(i)$, then the mean-squared error between the DAC 112, 114 output signal r and the original signal x may be found by the following equation:

$$E\{(r-x)^2\} = \quad \text{Equation 2.0}$$

$$2\int_{-\infty}^{\infty}\left[\sum_{k=1}^{\frac{L}{2}-1}\int_{(k-1)\Delta}^{k\Delta}\left(x-\frac{(2k-1)\Delta}{2}\right)^2 p_x(x,i)\,dx + \right.$$

-continued $$\left.\int_{\frac{L\Delta}{2}}^{\infty}\left(x-\frac{(L-1)\Delta}{2}\right)^2 p_x(x,i)\,dx\right| p_i(i)\,di$$

If x is a cdma2000 transmitted signal, then the function $p_x(x,i)$ is not continuous over i. Therefore, the mean-squared error derivation of Equation 2.0 cannot be evaluated using a Riemann integral, since the Riemann integral may only be used on continuous functions. Thus, one cannot find an optimal quantizer in the Lloyd-Max sense for the output of this filter. However, due to the fact that the signal to be quantized in this case is cyclostationary (i.e., its statistics are invariant to a shift of the time origin by integral multiples of a constant), the Lebesgue integral may be evaluated. If the function $p_x(x,i)$ is in fact cyclostationary with period T, then it will satisfy the relationship $p_x(x,i)=p_x(x,i+NT)$, where N is an integer. Moreover, assume that the function $p_x(x,i)$ changes k times over one period. In addition, assume one period may be broken down into the disjoint intervals $\{(A_0,A_1),(A_1,A_2), \ldots ,(A_{k-1},A_k)\}$, where the following hold true: (1) $A_0<A_1< \ldots <A_k$(2) $A_k-A_0=T$, and (3) $p_x(x,A_j)=p_x(x,A_j+\epsilon)$ for $0\leqq\epsilon<A_{j+1}-A_j$ and integer value j satisfying 0<j<k. In this case, the pdf of i for $p_x(x,i)$ may be written as $$p(i)=\frac{1}{A_{j+1}-A_j},\quad A_j\leq i<A_{j+1} \qquad \text{Equation 3.0}$$

Now, the relationship of Equation 2.0 may be evaluated in a piecewise form. In the embodiment of FIG. 1, the number of pdf's can be determined from using values of oversampling ration, L, of 4, with a pulse-shaping filter of length of N=48 taps. In this case, where N is an integer multiple of L, the number of pdf's is equal to L/2 or 2. If these two pdf's are denoted as $p_x(x, 1)$ and $p_x(x, 2)$, then the mean-squared error may now be written as $$E\{(r-x)^2\} = \sum_{k=1}^{\frac{L}{2}-1}\int_{(k-1)\Delta}^{k\Delta}\left(x-\frac{(2k-1)\Delta}{2}\right)^2 p_x(x,1)\,dx + \quad \text{Equation 4.0}$$

$$\int_{\frac{L\Delta}{2}}^{\infty}\left(x-\frac{(L-1)\Delta}{2}\right)^2 p_x(x,1)\,dx +$$

$$\sum_{k=1}^{\frac{L}{2}-1}\int_{(k-1)\Delta}^{k\Delta}\left(x-\frac{(2k-1)\Delta}{2}\right)^2 p_x(x,2)\,dx +$$

$$\int_{\frac{L\Delta}{2}}^{\infty}\left(x-\frac{(L-1)\Delta}{2}\right)^2 p_x(x,2)\,dx$$

Thus given $\log_2 L$ bits available in the DAC, an optimal quantizer may be found by minimizing the mean-squared error given in Equation 4.0. This can be accomplished by scaling the input signal x to adjust the signal variance with respect to the maximum output signal level of DAC 104, 106.

The scaling is necessary to reduce the loss of signal quality resulting from D/A conversion while fixing the granularity of the D/A converter. The optimal scaling factor is determined empirically through simulation of D/A conversion of typical test data under different scaling factors. After scaling, the input signal variance is adjusted as a function of the square of the scaling other words, given that the input signal x with variance $\sigma_x^2$ is scaled by a factor K, the resulting signal variance is $K^2\ \sigma_x^2$.

Figure 3B:
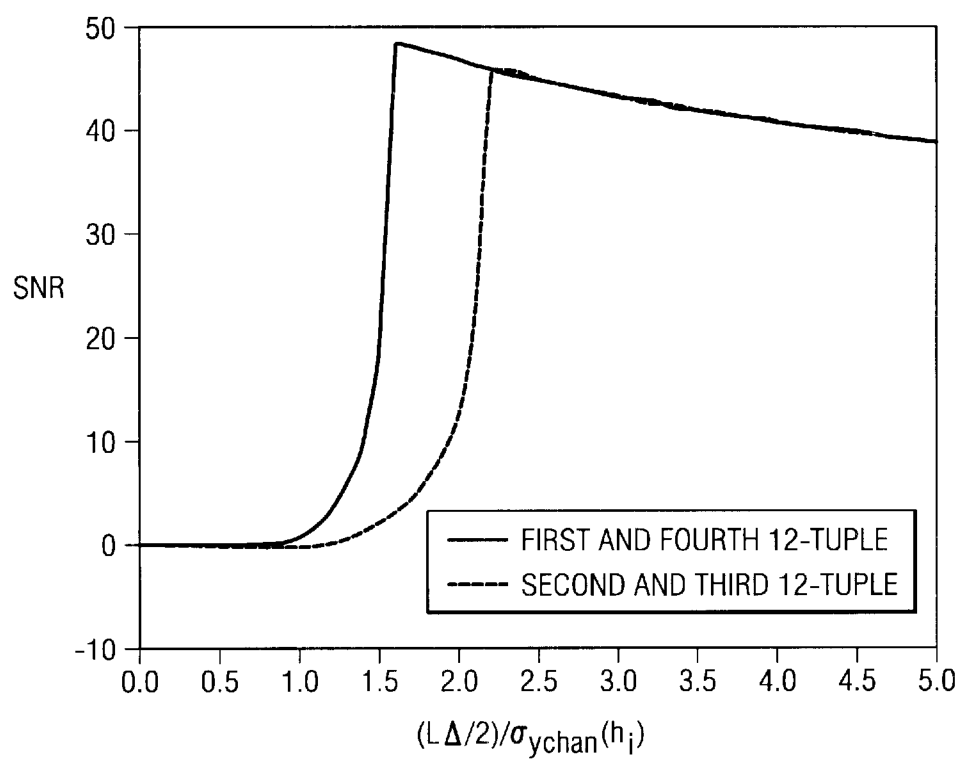
FIG. 3B is a plot illustrating signal-to-quantization noise as a function of scaling constant according to an embodiment of the invention.

The scaling factor, which results from the minimum mean-squared error for x, may also be found analytically. FIG. 3A illustrates the signal-to-quantization noise ratio simulated for different scaling factors optimized over an enter pdf distribution. Sample data are passed through the baseband pulse-shaping filter, scaled, and quantized, using 8 bits of quantization were available. The results are shown for different scaling factors in FIG. 3A. An adaptive quantizer, which changes with the changing pdf in time is impractical with a typical DAC. Adapting the scaling prior to the DAC 112, 114 can result in spectral distortion. This is due to the fact that the scaling adaptation rate is at 2 times the chipping rate; although the change in scaling may be slight, this could result in significant spectral growth. Therefore, it is desirable to optimize the quantizer over the time-varying pdf. FIG. 3B illustrates the signal-to-quantization noise ration achieved for different scaling factors optimized for an instantaneous pdf. FIG. 3B is shows optimal scaling for the two pdf's present in a cdma2000 reverse link channel in FIG. 3B. In this case, the signal-to-quantization noise ratios are shown for different scaling factors based on all instantaneous pdf's appearing in the input signal, while in FIG. 3A the signal-to-quantization noise ratios were determined with respect to the input signal regardless of instantaneous pdf. Comparing FIG. 3A and FIG. 3B, it is observed that although the peak SNR's of the distribution depicted in FIG. 3B fall above and below the peak SNR of the quantizer optimized over the entire distribution by nearly the same distance.

The cdma2000 signal filter output of FIG. 1 has two positive scaling factors, denoted as $k_1$ and $k_2$. If the scaling factors are represented as a square wave defined as:

$$k(l)=\begin{cases}k_1, & l=\ldots,-8,-7,-4,-3,0,1,4,5,8,9,12,13,\ldots\\ k_2, & l=\ldots,-6,-5,-2,-1,2,3,6,7,10,11,14,15,\ldots\end{cases}\qquad\text{Equation 5.0}$$

and a square function t(l) is defined as:

$$t(l)=sgn(\cos(l))\qquad\text{Equation 6.0}$$

Then the following may be derived:

$$k(l)=(t(l)+1)\left|\frac{k_2-k_1}{2}\right|+(\min(k_1,k_2))\qquad\text{Equation 7.0}$$

Since a square function may be written in terms of its Fourier series as a sum of sinusoids, we can redefine t(l) as $$t(l)=\sum_{i=0}^{\infty}\frac{(-1)^i}{2i+1}\cos\left(\frac{\pi}{2}(2i+1)l\right)\qquad\text{Equation 8.0}$$

The discrete-time Fourier transform of t(l) is given by:

$$T(e^{j\omega})=\sum_{i=0}^{\infty}\frac{\pi(-1)^i}{2i+1}\sum_{k=-\infty}^{\infty}\left[\delta\left(\omega-\frac{\pi}{2}(2i+1)+2\pi k\right)+\delta\left(\omega+\frac{\pi}{2}(2i+1)+2\pi k\right)\right]\qquad\text{Equation 9.0}$$

The discrete-time Fourier transform of k(l) may now be found in terms of the discrete-time Fourier transform of t(l) as $$K(e^{j\omega})=\left|\frac{k_2-k_1}{2}\right|T(e^{j\omega})+\left(\left|\frac{k_2-k_1}{2}\right|+\min(k_1,k_2)\right)\sum_{k=-\infty}^{\infty}2\pi\delta(\omega+2\pi k)\qquad\text{Equation 10.0}$$

In Equation 9.0, the second term in the sum is essentially a DC-offset term. The leftover square wave has a spectral response with the fundamental frequency centered at the chipping frequency. Multiplying this scaling signal by x(l) will result in a convolution of the spectral responses of the two signals. Therefore, the resultant spectrum of x(l) is $$K(e^{j\omega})*Y_{chan}(e^{j\omega})=\left|\frac{k_2-k_1}{2}\right|\sum_{i=0}^{\infty}\frac{\pi(-1)^i}{2i+1}\sum_{k=-\infty}^{\infty}\left[Y_{chan}\left(e^{j(\omega-\frac{\pi}{2}(2i+1)+2\pi k)}\right)+Y_{chan}\left(e^{j(\omega+\frac{\pi}{2}(2i+1)+2\pi k)}\right)\right]+\left(\left|\frac{k_2-k_1}{2}\right|+\min(k_1,k_2)\right)\sum_{k=-\infty}^{\infty}2\pi Y_{chan}(e^{j(\omega+2\pi k)})\qquad\text{Equation 11.0}$$

Since x(l) is band limited to half of the chipping frequency, then the spectrum after adaptive scaling could reach as high as 1½ times the chipping frequency, due to the first term in Equation 11.0. In addition, higher-order spectral products resulting from the odd harmonics of k(l) also result in spectral distortion. The second term in Equation 11.0 results in a DC-offset. However, as $k_1$ and $k_2$ move closer together in value, the more k(l) resembles a constant, which results in no spectral modification of $Y_{chan}(l)$. This can be seen by examining Equation 10.0, which leads to $$\lim_{k_1\to k_2}k(l)=k_1=k_2\qquad\text{Equation 12.0}$$

As a result, the following spectrum results $$\lim_{k_1\to k_2}K(e^{j\omega})*Y_{chan}(e^{j\omega})=k_1\sum_{k=-\infty}^{\infty}2\pi Y_{chan}(e^{j(\omega+2\pi k)})=k_2\sum_{k=-\infty}^{\infty}2\pi Y_{chan}(e^{j(\omega+2\pi k)})\qquad\text{Equation 13.0}$$

If the optimal scaling factor is different for the different distributions, an adaptive quantization algorithm may result in significant spectral growth. There exists a tradeoff between spectral growth and quantization noise.

The spectral distortion after D/A conversion may be undone by resealing the signal before transmission. This involves multiplying the converted signal by 1/k(l). Additional amplification may be needed if the resealing operation results in a deviation from the desired output power.

This may be accomplished by adjusting an amplifier which follows the D/A converter at the same rate at which the scaling constant prior to D/A conversion is being adjusted. This may be implemented directly in the lowpass filter which normally follows a D/A converter, as this filter is usually an active filter.

Referring now to FIG. 2, therein is a functional block diagram of a TDMA transmitter according to an embodiment of the invention. Transmitter 200 comprises slot data input 202, serial-to-parallel converters 204, differential phase encoder 206, root-raised cosine filter 208 and 210, adaptive scaler 214 and 216, D/A converter 218 and 220, and lowpass filter 222 and 224.

For the embodiment of FIG. 2, root-raised cosine filters 208 and 210 have a length of N=25 taps and an oversampling ration, L, of 4. Since N is not an integer multiple of L in this case, the number of pdf's is equal to $L-|R-\mathrm{Ceil}(L/2)|$, where $0<R\leqq L-1$, and ceil (L/2) is the smaller integer greater than or equal to L/2, or the number of pdf's=4−|3−2|=3. Scaling constants and adaptive scaling are found for each pdf as described previously for FIG. 1.

Although the method an apparatus of the present invention has been illustrated and described with regard to particular embodiments thereof, it will be understood that numerous modifications and substitutions may be made to the embodiments described and that numerous other embodiments of the invention may be implemented without departing from the spirit and scope of the invention as defined in the following claims.

What is claimed is:

1. A method for generating a pulse amplitude modulated signal, said method comprising the steps of:

filtering a first signal through a digital pulse-shaping filter to generate a filtered output;

determining at least one scaling factor from said filtered output, wherein each at least one scaling factor is based upon a separate time-varying probability density function of at least one time-varying probability density function;

scaling said filtered output by said at least one scaling factor to generate a second signals; and converting said second signal from digital to analog to generate a third signal.

2. The method of claim 1, wherein said third signal is transmitted over a radio channel and wherein said method further comprises the step of:

adaptively amplifying said third signal according to said scaling performed in said step of scaling before transmission of said third signal on the radio channel.

3. The method of claim 2, wherein said step of scaling comprises scaling said first signal by at least one constant defined by a function k(l), and wherein said step of adaptively amplifying comprises multiplying said third signal by 1/k(l) before transmission on the radio channel.

4. The method of claim 2, wherein said step of adaptively amplifying comprises inputting said third signal to an analog filter before transmission and adaptively adjusting said analog filter according to k(l).

5. The method of claim 1, wherein said first signal comprises a CDMA signal.

6. The method of claim 5, wherein said at least one time-varying probability density function comprises two time-varying probability density functions.

7. The method of claim 6, wherein said CDMA signal comprises an aggregate CDMA signal.

8. The method of claim 1, wherein said first signal comprises a TDMA signal.

9. The method of claim 8, wherein said at least one time-varying probability density function comprises three time-varying probability density functions.

10. An apparatus for generating a pulse amplitude modulated signal, said apparatus comprising:

a digital pulse-shaping filter for receiving a first signal and generating a filtered output;

a scaler for determining at least one scaling factor from said filtered output, wherein each at least one scaling factor is based upon a separate time-varying probability density function of at least one time-varying probability function and for scaling said filtered output by said at least one scaling factor to generate a second signal; and a digital-to-analog converter coupled to said scaler, said digital-to-analog converter for converting said second signal from digital to analog to generate a third signal.

11. The apparatus of claim 10, wherein said apparatus transmits said third signal on a radio channel, and wherein said apparatus further comprises:

an adaptive amplifier coupled to said digital-to-analog converter, said adaptive amplifier for adaptively amplifying said third signal according to said scaling performed in said scaler before transmission of said third signal on the radio channel.

12. The apparatus of claim 11, wherein said scaler scales said first signal by at least one constant defined by a function k(l), and wherein said adaptive amplifier multiplies said third signal by 1/k(l) before transmission on the radio channel.

13. The apparatus of claim 11, wherein said scaler further generates scaling data and wherein said adaptive amplifier comprises an analog filter, wherein said analog filter receives said scaling data and adaptively amplifies said third signal according to said scaling data.

14. The apparatus of claim 10, wherein said first signal comprises a CDMA signal.

15. The apparatus of claim 14, wherein said at least one time-varying probability density function comprises two time-varying probability density functions.

16. The apparatus of claim 15, wherein said CDMA signal comprises an aggregate CDMA signal.

17. The apparatus of claim 10, wherein said first signal comprises a TDMA signal.

18. The apparatus of claim 17, wherein said at least one time-varying probability density function comprises three time-varying probability density functions.

* * * * *